(12) United States Patent
Maeda

(10) Patent No.: US 11,322,429 B2
(45) Date of Patent: May 3, 2022

(54) CIRCUIT MODULE

(71) Applicant: Murata Manufacturing Co., Ltd., Kyoto-fu (JP)

(72) Inventor: Yoshiro Maeda, Nagaokakyo (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 184 days.

(21) Appl. No.: 16/744,312

(22) Filed: Jan. 16, 2020

(65) Prior Publication Data
US 2020/0152552 A1  May 14, 2020

Related U.S. Application Data

(63) Continuation of application No. PCT/JP2018/025437, filed on Jul. 5, 2018.

(30) Foreign Application Priority Data

Jul. 20, 2017 (JP) .............................. JP2017-141313

(51) Int. Cl.
*H05K 1/00* (2006.01)
*H01L 23/485* (2006.01)
(Continued)

(52) U.S. Cl.
CPC ............ *H01L 23/485* (2013.01); *H01L 23/12* (2013.01); *H01L 23/50* (2013.01);
(Continued)

(58) Field of Classification Search
CPC ....... H01L 23/485; H01L 23/12; H01L 23/50; H01L 23/5286; H01L 23/49822;
(Continued)

(56) References Cited

U.S. PATENT DOCUMENTS

2005/0064732 A1 * 3/2005 Muench ................ H01L 23/057
439/55
2006/0103004 A1 * 5/2006 Sakai ................ H01L 23/49822
257/700

(Continued)

FOREIGN PATENT DOCUMENTS

JP          H06-45473 A      2/1994
JP          2017-45814 A     3/2017
KR      10-2007-0046732 A    5/2007

OTHER PUBLICATIONS

An Office Action mailed by the Korean Intellectual Property Office dated Mar. 14, 2021, which corresponds to Korean Patent Application No. 10-2019-7037446 and is related to U.S. Appl. No. 16/744,312 with English language translation.

(Continued)

*Primary Examiner* — Pete T Lee
(74) *Attorney, Agent, or Firm* — Studebaker & Brackett PC

(57) ABSTRACT

A circuit module includes a circuit board including an insulating layer, first and second signal conductors, a ground conductor, and a ground conductor layer; and an electronic component including first and second signal terminals and a first ground terminal. The ground conductor includes a first strip portion parallel to the first and second signal conductors. When a portion of the first signal conductor parallel to the second signal conductor and the first signal terminal are set as a first signal wiring line and a portion of the second signal conductor parallel to the first signal conductor and the second signal terminal are set as a second signal wiring line, the circuit board includes a first strip portion connection via conductor that connects the first strip portion and the ground conductor layer in a region where the first and second signal wiring lines are parallel to each other.

18 Claims, 9 Drawing Sheets

(51) Int. Cl.
  *H01L 23/12* (2006.01)
  *H01L 23/50* (2006.01)
  *H01L 23/528* (2006.01)
  *H05K 1/02* (2006.01)
  *H05K 1/18* (2006.01)
  *H05K 7/02* (2006.01)

(52) U.S. Cl.
  CPC ....... *H01L 23/5286* (2013.01); *H05K 1/0213* (2013.01); *H05K 1/0215* (2013.01); *H05K 1/0218* (2013.01); *H05K 1/0296* (2013.01); *H05K 1/181* (2013.01); *H05K 7/02* (2013.01)

(58) Field of Classification Search
  CPC ..... H01L 23/49838; H01L 2224/16225; H01L 23/60; H01L 23/525; H05K 1/0213; H05K 1/0296; H05K 1/0215; H05K 1/0218; H05K 1/181; H05K 7/02; H05K 1/114; H05K 2201/10696; H05K 2201/10689; H05K 1/0219; H05K 2201/09609; H05K 2201/09618; H05K 2201/09336; H05K 1/0243; H05K 1/0263
  See application file for complete search history.

(56) References Cited

U.S. PATENT DOCUMENTS

| 2007/0102830 | A1  | 5/2007  | Muto et al. |
| 2010/0175251 | A1* | 7/2010  | Muto .................... H05K 1/118 29/846 |
| 2013/0120198 | A1* | 5/2013  | Maeda .................... H01Q 9/42 343/700 MS |
| 2015/0257266 | A1* | 9/2015  | Murayama ............... H01Q 9/20 235/492 |
| 2016/0095211 | A1* | 3/2016  | Goto .................... H05K 1/0251 398/135 |
| 2016/0135300 | A1* | 5/2016  | Inagaki ................ H05K 1/0298 361/783 |
| 2017/0064817 | A1* | 3/2017  | Lam ....................... H05K 1/115 |
| 2019/0199001 | A1* | 6/2019  | Kato ....................... H01Q 1/24 |
| 2019/0363417 | A1* | 11/2019 | Xu ......................... H05K 1/025 |

OTHER PUBLICATIONS

International Search Report issued in PCT/JP2018/025437; dated Sep. 11, 2018.
International Preliminary Report on Patentability and Written Opinion issued in PCT/JP2018/025437; dated Jan. 21, 2020.

* cited by examiner

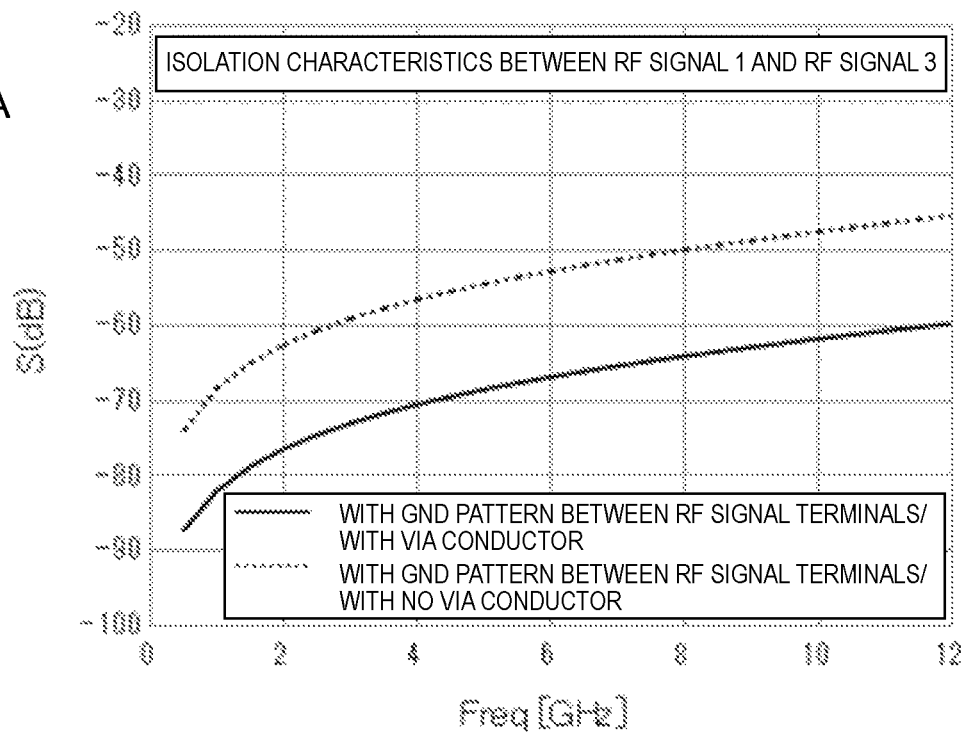

CIRCUIT MODULE

CROSS-REFERENCE TO RELATED APPLICATIONS

This application claims benefit of priority to International Patent Application No. PCT/JP2018/025437, filed Jul. 5, 2018, and to Japanese Patent Application No. 2017-141313, filed Jul. 20, 2017, the entire contents of each are incorporated herein by reference.

BACKGROUND

Technical Field

The present disclosure relates to a circuit module that includes a circuit board including an insulating layer, a first signal conductor, a second signal conductor, a ground conductor, and a ground conductor layer and an electronic component including a first signal terminal, a second signal terminal, and a ground terminal.

Background Art

Examples of a circuit board including an insulating layer, a first signal conductor, a second signal conductor, and a ground conductor include the circuit board disclosed in Japanese Unexamined Patent Application Publication No. 2017-45814. FIGS. 10A and 10B are a top view and a cross-sectional view, respectively, of the circuit board disclosed in Japanese Unexamined Patent Application Publication No. 2017-45814. FIG. 10A is a top view of a circuit board 510. FIG. 10B is a cross-sectional view of the circuit board 510 cut along a plane including line A-A illustrated in FIG. 10A.

The circuit board 510 includes an insulating layer 511, a first signal conductor 512, a second signal conductor 513, and a ground conductor 514. The first signal conductor 512 and the second signal conductor 513 are strip conductors placed on the main surface of the insulating layer 511 and including respective portions parallel to each other.

The ground conductor 514 is placed on the main surface of the insulating layer 511 and includes a planar portion 514a and a strip portion 514b. The planar portion 514a is a planar conductor formed to cover the main surface of the insulating layer 511 without being in contact with the above two signal conductors. The strip portion 514b is a strip conductor which extends between the above two signal conductors, one end of which is connected to the planar portion 514a, and the other end of which is located between the parallel portions of the two signal conductors.

In the insulating layer 511, a recess portion 511d is formed at an optional position directly below the strip portion 514b. The recess portion 511d is filled with a part of the strip portion 514b. The recess portion 511d is formed to ensure that the filled part of the strip portion 514b and a conductive layer 516, which may be formed below the recess portion 511d, are not short-circuited.

SUMMARY

A case where a circuit module is formed by connecting an electronic component (not illustrated) to the circuit board 510 disclosed in Japanese Unexamined Patent Application Publication No. 2017-45814 will be considered. In this circuit module, a first signal wiring line is formed of the first signal conductor 512 and a first signal terminal (not illustrated) of the electronic component. A second signal wiring line is formed of the second signal conductor 513 and a second signal terminal (not illustrated) of the electronic component. A ground wiring line is formed of the strip portion 514b and a ground terminal (not illustrated) of the electronic component.

The leakage of a signal between the first signal wiring line and the second signal wiring line on the main surface of the insulating layer 511 is suppressed by the ground wiring line. In contrast, the leakage of a signal in the insulating layer 511 is not suppressed with this structure. Accordingly, the isolation between the first signal wiring line and the second signal wiring line may be insufficient.

That is, the present disclosure provides a circuit module with which the leakage of a signal between the first signal wiring line and the second signal wiring line both on the main surface of the insulating layer and in the insulating layer is suppressed and a high degree of isolation between the first signal wiring line and the second signal wiring line can be obtained.

In a circuit module according to the present disclosure, the structure of a ground wiring line is improved to suppress the leakage of a signal between a first signal wiring line and a second signal wiring line in an insulating layer.

A circuit module according to the present disclosure includes a circuit board including an insulating layer, a first signal conductor, a second signal conductor, a ground conductor, and a ground conductor layer and an electronic component including a first signal terminal, a second signal terminal, and a first ground terminal.

The first signal conductor and the second signal conductor are strip conductors placed on a main surface of the insulating layer and including respective portions parallel to each other. The ground conductor is placed on the main surface of the insulating layer and includes a first strip portion parallel to the first signal conductor and the second signal conductor between the first signal conductor and the second signal conductor. The first signal conductor is connected to the first signal terminal, the second signal conductor is connected to the second signal terminal, and the first strip portion is connected to the first ground terminal.

A connection body between the portion of the first signal conductor parallel to the second signal conductor and the first signal terminal is set as a first signal wiring line. A connection body between the portion of the second signal conductor parallel to the first signal conductor and the second signal terminal is set as a second signal wiring line. A connection body between the first strip portion and the first ground terminal is set as a first ground wiring line. In this case, the first ground wiring line is located between the first signal wiring line and the second signal wiring line in a region where the first signal wiring line and the second signal wiring line are parallel to each other.

The circuit board includes at least one first strip portion connection via conductor that connects the first strip portion and the ground conductor layer in the region where the first signal wiring line and the second signal wiring line are parallel to each other.

In the above circuit module, the leakage of a signal between the first signal wiring line and the second signal wiring line on the main surface of the insulating layer is suppressed by the first ground wiring line. The leakage of a signal between the first signal wiring line and the second signal wiring line in the insulating layer is suppressed by the first strip portion connection via conductor. That is, a high degree of isolation between the first signal wiring line and the second signal wiring line can be obtained.

A circuit module according to the present disclosure preferably has the following feature. That is, the first strip portion connection via conductor is placed in a middle portion of the first ground wiring line in the region where the first signal wiring line and the second signal wiring line are parallel to each other.

In the above circuit module, the leakage of a signal between the first signal wiring line and the second signal wiring line in the insulating layer is more effectively suppressed. That is, a higher degree of isolation between the first signal wiring line and the second signal wiring line can be obtained.

A circuit module according to the present disclosure and a preferred embodiment of the circuit module may have the following feature. That is, the ground conductor further includes a second strip portion that is adjacently in parallel with the second signal conductor. The electronic component further includes a second ground terminal. The second strip portion is connected to the second ground terminal. When a connection body between the second strip portion and the second ground terminal is set as a second ground wiring line, the second ground wiring line is adjacent to the second signal wiring line to sandwich the second signal wiring line along with the first ground wiring line.

The circuit board further includes at least one second strip portion connection via conductor that connects the second strip portion and the ground conductor layer.

In the above circuit module, the leakage of a signal from the second signal wiring line in the insulating layer is more effectively suppressed. That is, a higher degree of isolation between the first signal wiring line and the second signal wiring line can be obtained.

A circuit module according to the present disclosure and a preferred embodiment of the circuit module may have the following feature. The circuit board further includes a third signal conductor and a fourth signal conductor. The third signal conductor and the fourth signal conductor are strip conductors placed on the main surface of the insulating layer and including respective portions parallel to each other. The third signal conductor extends to face the first signal conductor on an axis on which the first signal conductor extends. The fourth signal conductor extends to face the second signal conductor on an axis on which the second signal conductor extends.

The ground conductor further includes a third strip portion parallel to the third signal conductor and the fourth signal conductor between the third signal conductor and the fourth signal conductor. The third strip portion extends to face the first strip portion on an axis on which the first strip portion extends.

The electronic component further includes a third signal terminal, a fourth signal terminal, and a third ground terminal. The third signal conductor is connected to the third signal terminal, the forth signal conductor is connected to the forth signal terminal, and the third strip portion is connected to the third ground terminal.

A connection body between the portion of the third signal conductor parallel to the fourth signal conductor and the third signal terminal is set as a third signal wiring line. A connection body between the portion of the fourth signal conductor parallel to the third signal conductor and the fourth signal terminal is set as a fourth signal wiring line. A connection body between the third strip portion and the third ground terminal is set as a third ground wiring line. In this case, the third ground wiring line is located between the third signal wiring line and the fourth signal wiring line in a region where the third signal wiring line and the fourth signal wiring line are parallel to each other.

The circuit board further includes at least one third strip portion connection via conductor that connects third strip portion and the ground conductor layer in a region where the third signal wiring line and the fourth signal wiring line are parallel to each other.

In the above circuit module, the leakage of a signal between the third signal wiring line and the fourth signal wiring line on the main surface of the insulating layer is suppressed by the third ground wiring line. The leakage of a signal between the third signal wiring line and the fourth signal wiring line in the insulating layer is suppressed by the third strip portion connection via conductor. That is, even in a case where a multi-terminal electronic component is used and the first to fourth signal wiring lines are formed, a high degree of isolation between the first signal wiring line and the second signal wiring line and between the third signal wiring line and the fourth signal wiring line can be obtained. Even if the number of signal wiring lines further increases, a similar effect can be obtained by the extension of the above structure.

Of a circuit module according to the present disclosure and a preferred embodiment of the circuit module, a circuit module in which the ground conductor further includes the third strip portion may have the following feature. That is, the third strip portion connection via conductor is place in a middle portion of the third ground wiring line in a region where the third signal wiring line and the fourth signal wiring line are parallel to each other.

In the above circuit module, the leakage of a signal between the third signal wiring line and the fourth signal wiring line in the insulating layer is more effectively suppressed. That is, a higher degree of isolation between the third signal wiring line and the fourth signal wiring line can be obtained.

Of a circuit module according to the present disclosure and a preferred embodiment of the circuit module, a circuit module in which the ground conductor further includes the third strip portion may have the following feature. That is, the ground conductor further includes a fourth strip portion that is adjacently in parallel with the fourth signal conductor. The electronic component further includes a fourth ground terminal. The fourth strip portion is connected to the fourth ground terminal. When a connection body between the fourth strip portion and the fourth ground terminal is set as a fourth ground wiring line, the fourth ground wiring line is adjacent to the fourth signal wiring line to sandwich the fourth signal wiring line along with the third ground wiring line.

The circuit board further includes at least one fourth strip portion connection via conductor that connects the fourth strip portion and the ground conductor layer.

In the above circuit module, the leakage of a signal from the fourth signal wiring line in the insulating layer is more effectively suppressed. That is, a higher degree of isolation between the third signal wiring line and the fourth signal wiring line can be obtained.

Of a circuit module according to the present disclosure and a preferred embodiment of the circuit module, a circuit module in which the ground conductor further includes the third strip portion may have the following feature. That is, the ground conductor further includes a fifth strip portion that extends in a direction orthogonal to the first strip portion and the third strip portion. The first strip portion and the third strip portion are connected to the fifth strip portion.

The circuit board further includes at least one fifth strip portion connection via conductor that connects the fifth strip portion and the ground conductor layer.

Even in a case where a multi-terminal electronic component is used and the first to fourth signal wiring lines are formed, a high degree of isolation between the first signal wiring line and the third signal wiring line and between the second signal wiring line and the fourth signal wiring line can be obtained. Even if the number of signal wiring lines further increases, a similar effect can be obtained by the extension of the above structure.

In a circuit module according to the present disclosure, the leakage of a signal between the first signal wiring line and the second signal wiring line both on the main surface of the insulating layer and in the insulating layer is suppressed and a high degree of isolation between the first signal wiring line and the second signal wiring line can be obtained.

BRIEF DESCRIPTION OF THE DRAWINGS

FIG. 7A is a diagram illustrating the comparison between frequency characteristics of the isolation between the first signal wiring line and a third signal wiring line in a circuit module according to the second embodiment of the present disclosure and the isolation between the same two signal wiring lines in a circuit module that is a comparative example, and FIG. 7B is a table indicating measurement values;

DETAILED DESCRIPTION

The feature of the present disclosure will be described in detail below with reference to embodiments of the present disclosure. The present disclosure is applied to, for example, a circuit module in which a multipolar connector is connected to a circuit board. The present disclosure can be applied to other circuit modules.

—Circuit Module According to First Embodiment—

The structure of a circuit module according to the first embodiment of the present disclosure will be described with reference to FIGS. 1 and 2.

Each drawing is a schematic diagram and does not necessarily reflect the dimensions of actual products. In addition, the respective drawings do not necessarily reflect variations in the shapes of components that occur during manufacturing processes. That is, in the present specification, the drawings that will be referred to in the following description essentially illustrate the actual products even if there are differences between the drawings and the actual products.

Figure 1A:
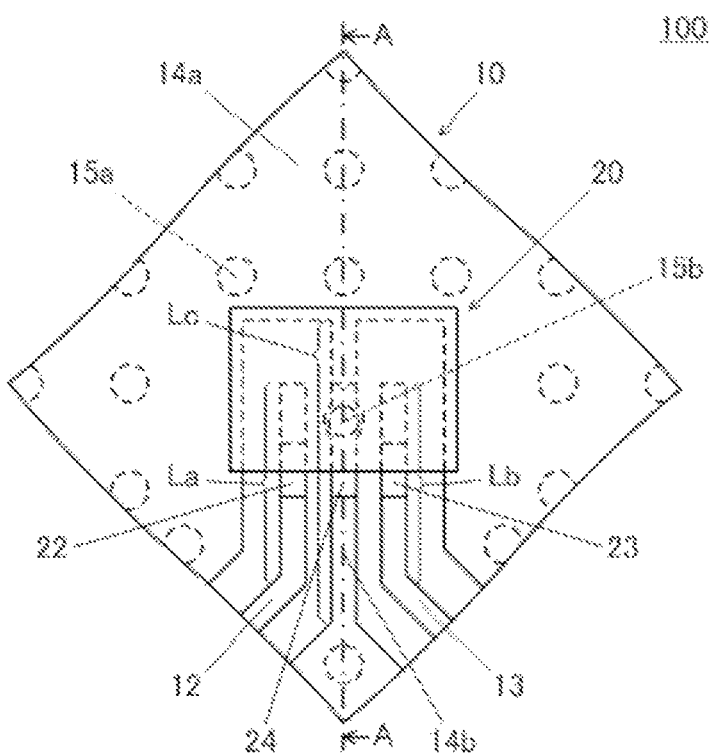
FIGS. 1A and 1B are a top view and a cross-sectional view, respectively, of a circuit module according to a first embodiment of the present disclosure.
Figure 1B:
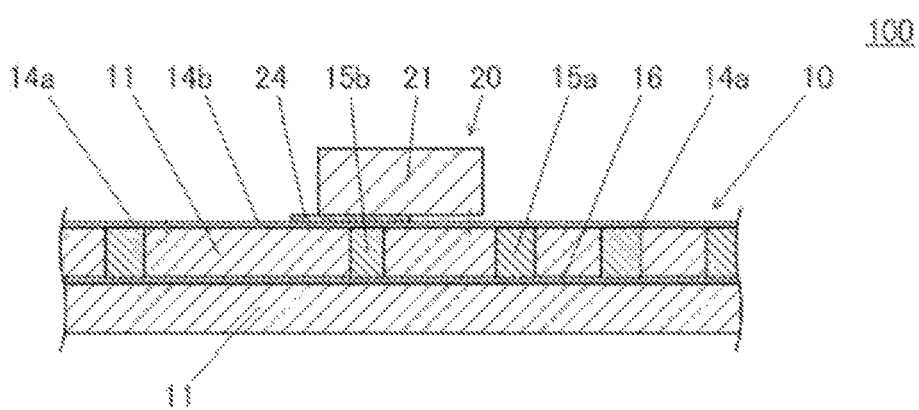
Figure 2A:
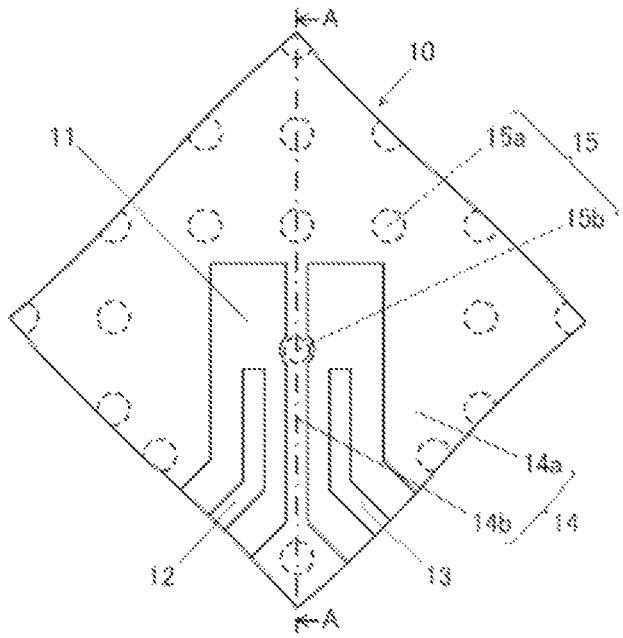
FIGS. 2A and 2B are a top view and a cross-sectional view, respectively, of a circuit board included in a circuit module according to the first embodiment of the present disclosure.
Figure 2B:
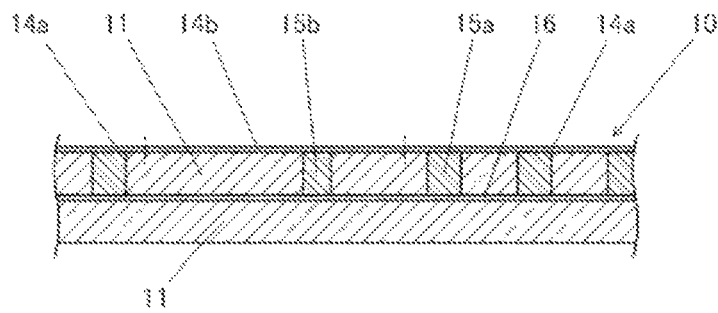
Figure 2C:
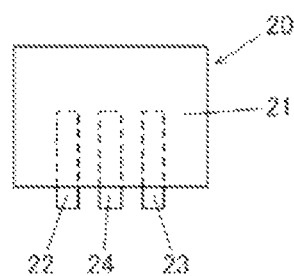
FIG. 2C is a top view of an electronic component.

FIGS. 1A and 1B are a top view and a cross-sectional view, respectively, of a circuit module according to the first embodiment of the present disclosure. FIG. 1A is a top view of a circuit module 100. FIG. 1B is a cross-sectional view of the circuit module 100 cut along a plane including line A-A illustrated in FIG. 1A. FIGS. 2A and 2B are a top view and a cross-sectional view, respectively, of a circuit board included in a circuit module according to the first embodiment of the present disclosure, and FIG. 2C is a top view of an electronic component. FIG. 2A is a top view of a circuit board 10 included in the circuit module 100. FIG. 2B is a cross-sectional view of the circuit board 10 cut along a plane including line A-A illustrated in FIG. 2A. FIG. 2C is a top view of an electronic component 20. That is, FIGS. 2A-2C illustrate components in the circuit module 100 before assembly for ease of understanding of the shapes of the respective components.

The circuit module 100 includes the circuit board 10 and the electronic component 20. The circuit board 10 includes an insulating layer 11, a first signal conductor 12, a second signal conductor 13, a ground conductor 14, a via conductor 15, and a ground conductor layer 16. The electronic component 20 includes a component base body 21, a first signal terminal 22, a second signal terminal 23, and a first ground terminal 24.

The first signal conductor 12 and the second signal conductor 13 are strip conductors placed on the main surface of the insulating layer 11 and including respective portions parallel to each other. The ground conductor 14 is placed on the main surface of the insulating layer 11 and includes a planar portion 14a and a first strip portion 14b.

The planar portion 14a is a planar conductor formed to cover the main surface of the insulating layer 11 without being in contact with the above two signal conductors. One end of the first strip portion 14b is connected to a predetermined point of the planar portion 14a and the other end of the first strip portion 14b is connected another point of the planar portion 14a. The first strip portion 14b is placed to be parallel to the first signal conductor 12 and the second signal conductor 13 between the first signal conductor 12 and the second signal conductor 13.

The first signal conductor 12 is connected to the first signal terminal 22. The second signal conductor 13 is connected to the second signal terminal 23. The first strip portion 14b is connected to the first ground terminal 24. The ground conductor layer 16 is provided between the two insulating layers 11 and is connected to a ground electrode (not illustrated).

A connection body between the portion of the first signal conductor 12 parallel to the second signal conductor 13 and the first signal terminal 22 is set as a first signal wiring line La. A connection body between the portion of the second signal conductor 13 parallel to the first signal conductor 12 and the second signal terminal 23 is set as a second signal wiring line Lb. A connection body between the first strip portion 14b and the first ground terminal 24 is set as a first ground wiring line Lc. The first ground wiring line Lc is located between the first signal wiring line La and the second signal wiring line Lb in a region where the first signal wiring line La and the second signal wiring line Lb are parallel to each other.

The via conductor 15 includes at least one planar portion connection via conductor 15a and at least one first strip portion connection via conductor 15b. The planar portion connection via conductor 15a connects the planar portion 14a and the ground conductor layer 16. The first strip portion connection via conductor 15b connects the first strip portion 14b and the ground conductor layer 16.

In the circuit module 100, the leakage of a signal between the first signal conductor 12 and the second signal conductor 13 on the main surface of the insulating layer 11 is suppressed by a shielding effect provided for the first ground wiring line Lc. The leakage of a signal between the first signal wiring line La and the second signal wiring line Lb in the insulating layer 11 is suppressed by a shielding effect provided for the first strip portion connection via conductor 15b. That is, the connection of the first strip portion connection via conductor 15b to the first ground wiring line Lc provides a high degree of isolation between the first signal wiring line La and the second signal wiring line Lb.

Figure 3A:
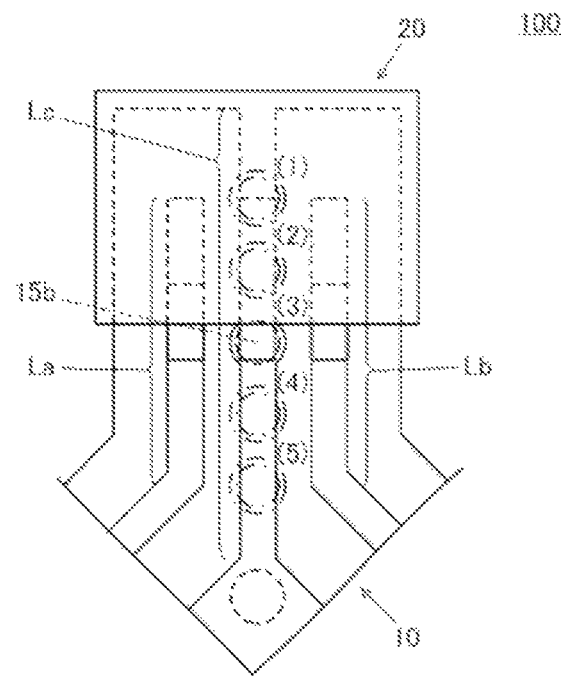
FIGS. 3A and 3B are top views describing an exemplary experiment conducted to determine a preferred position of a first strip portion connection via conductor in a circuit module according to the first embodiment of the present disclosure.

An exemplary experiment conducted to determine a preferred position of the first strip portion connection via conductor 15b in the circuit module 100 will be described with reference to FIGS. 3A and 3B. FIG. 3A is a top view describing an exemplary experiment conducted to determine a preferred position of a first strip portion connection via conductor in a circuit module according to the first embodiment of the present disclosure. FIG. 3A is a top view of a part of the circuit module 100 in which various changes in the position of the first strip portion connection via conductor 15b are schematically illustrated. The other components in the circuit module 100 are the same as those described above, and the further description thereof will be omitted.

In FIG. 3A, (1) represents a case where the first strip portion connection via conductor 15b is placed at one end of the first ground wiring line Lc in a region where the first signal wiring line La and the second signal wiring line Lb are parallel to each other, (5) represents a case where the first strip portion connection via conductor 15b is placed at the other end of the first ground wiring line Lc in the above region, (3) represents a case where the first strip portion connection via conductor 15b is placed in the middle portion of the first ground wiring line Lc in the above region, (2) represents a case where the first strip portion connection via conductor 15b is placed at the midpoint between (1) and (3), and (4) represents a case where the first strip portion connection via conductor 15b is placed at the midpoint between (3) and (5).

Table 1 indicates the isolation between the first signal conductor 12 and the second signal conductor 13 in each of the above cases. Table 1 indicates the difference between the isolation in a circuit module in which the first strip portion connection via conductor 15b is not provided and the leakage of a signal in an insulating layer is not suppressed and the isolation in each of the above cases.

TABLE 1

| Position of Via Conductor | Isolation Characteristics | | | | | |
| --- | --- | --- | --- | --- | --- | --- |
| | with No Via Conductor | (1) | (2) | (3) | (4) | (5) |
| Amount of Improvement | —(Reference) | 1.7 dB | 3.4 dB | 3.6 dB | 2.7 dB | 1.7 dB |

Figure 3B:
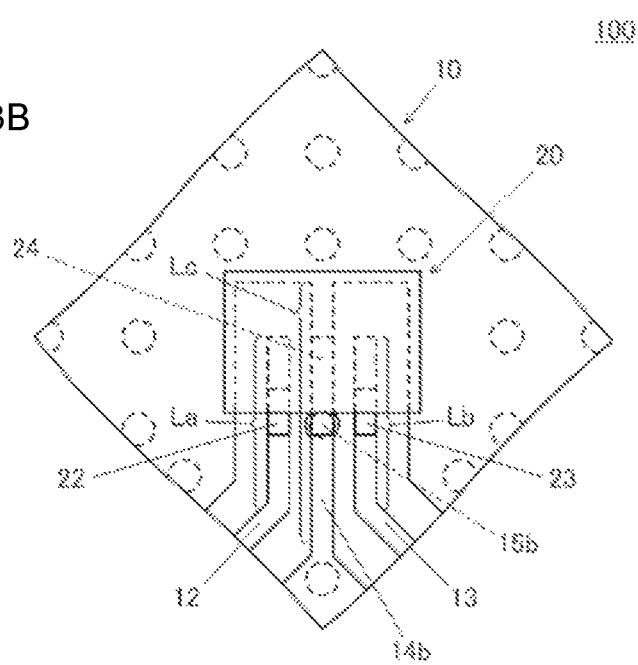

As is apparent from Table 1, it is desired that the first strip portion connection via conductor 15b be placed in the middle portion of the first ground wiring line Lc in the region where the first signal wiring line La and the second signal wiring line Lb are parallel to each other as illustrated in FIG. 3B. In this case, the leakage of a signal between the first signal wiring line La and the second signal wiring line Lb in the insulating layer 11 is more effectively suppressed. That is, a higher degree of isolation between the first signal wiring line La and the second signal wiring line Lb can be obtained.

—Circuit Module According to Second Embodiment—

The structure of a circuit module according to the second embodiment of the present disclosure will be described with reference to FIG. 4.

Figure 4:
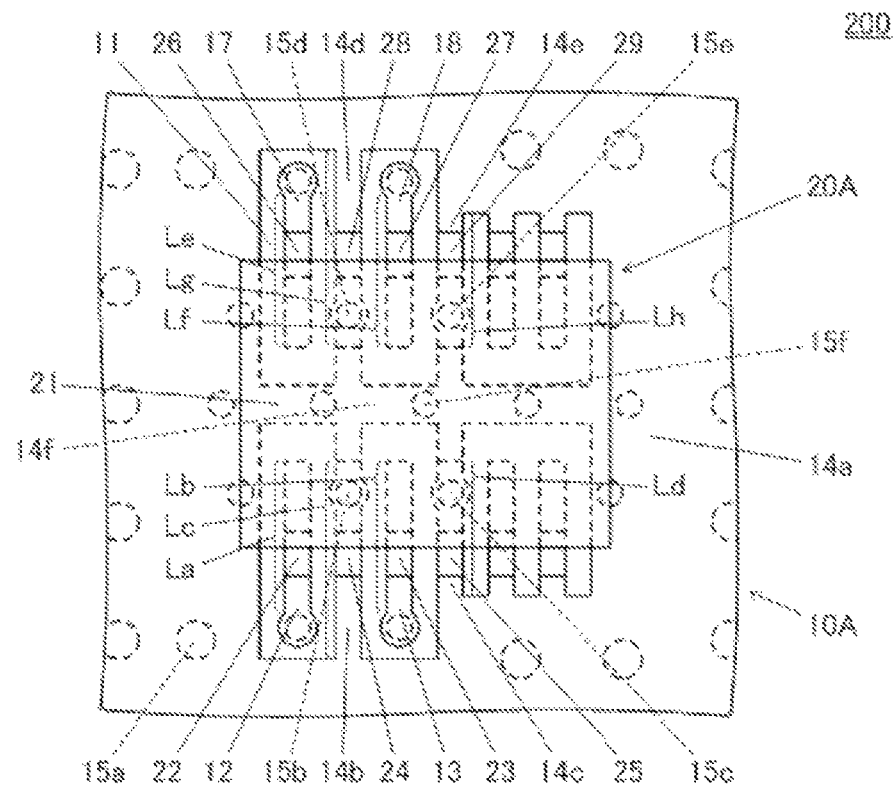
FIG. 4 is a top view of a circuit module according to a second embodiment of the present disclosure.

FIG. 4 is a top view of a circuit module according to the second embodiment of the present disclosure. A circuit module 200 includes a circuit board 10A and an electronic component 20A. The circuit board 10A includes the insulating layer 11, the first signal conductor 12, the second signal conductor 13, a third signal conductor 17, a fourth signal conductor 18, the ground conductor 14, the via conductor 15, and the ground conductor layer 16. The electronic component 20A includes the component base body 21, the first signal terminal 22, the second signal terminal 23, a third signal terminal 26, a fourth signal terminal 27, the first ground terminal 24, a second ground terminal 25, a third ground terminal 28, and a fourth ground terminal 29.

The third signal conductor 17 and the fourth signal conductor 18 are strip conductors placed on the main surface of the insulating layer 11 and including respective portions parallel to each other. The third signal conductor 17 extends to face the first signal conductor 12 on an axis on which the first signal conductor 12 extends. The fourth signal conductor 18 extends to face the second signal conductor 13 on an axis on which the second signal conductor 13 extends.

The ground conductor 14 is placed on the main surface of the insulating layer 11 and further includes a second strip portion 14c, a third strip portion 14d, a fourth strip portion 14e, and a fifth strip portion 14f in addition to the planar portion 14a and the first strip portion 14b.

The second strip portion 14c is adjacently in parallel with the second signal conductor 13. The third strip portion 14d is placed in parallel with the third signal conductor 17 and the fourth signal conductor 18 between the third signal conductor 17 and the fourth signal conductor 18. The fourth strip portion 14e is adjacently in parallel with the fourth signal conductor 18.

The third signal conductor 17 is connected to the third signal terminal 26. The fourth signal conductor 18 is connected to the fourth signal terminal 27. The second strip portion 14c is connected to the second ground terminal 25. The third strip portion 14d is connected to the third ground terminal 28. The fourth strip portion 14e is connected to the fourth ground terminal 29.

A second ground wiring line Ld that is a connection body between the second strip portion 14c and the second ground terminal 25 is adjacent to the second signal wiring line Lb to sandwich the second signal wiring line Lb along with the first ground wiring line Lc.

A connection body between a portion of the third signal conductor 17 parallel to the fourth signal conductor 18 and the third signal terminal 26 is set as a third signal wiring line Le. A connection body between a portion of the fourth signal conductor 18 parallel to the third signal conductor 17 and the fourth signal terminal 27 is set as a fourth signal wiring line Lf. A connection body between the third strip portion 14d and the third ground terminal 28 is set as a third ground wiring line Lg. The third ground wiring line Lg is located between the third signal wiring line Le and the fourth signal wiring line Lf in a region where the third signal wiring line Le and the fourth signal wiring line Lf are parallel to each other.

A fourth ground wiring line Lh that is a connection body between the fourth strip portion 14e and the fourth ground terminal 29 is adjacent to the fourth signal wiring line Lf to sandwich the fourth signal wiring line Lf along with the third ground wiring line Lg.

The fifth strip portion 14f extends in a direction orthogonal to the first strip portion 14b, the second strip portion 14c, the third strip portion 14d, and the fourth strip portion 14e. Each of the first strip portion 14b, the second strip portion 14c, the third strip portion 14d, and the fourth strip portion 14e is connected to the fifth strip portion 14f.

The via conductor 15 includes a second strip portion connection via conductor 15c, a third strip portion connection via conductor 15d, a fourth strip portion connection via conductor 15e, and a fifth strip portion connection via conductor 15f in addition to the above via conductors. The second strip portion connection via conductor 15c connects the second strip portion 14c and the ground conductor layer 16. The third strip portion connection via conductor 15d connects the third strip portion 14d and the ground conductor layer 16. The fourth strip portion connection via conductor 15e connects the fourth strip portion 14e and the ground conductor layer 16. The fifth strip portion connection via conductor 15f connects the fifth strip portion 14f and the ground conductor layer 16.

In the circuit module 200, the leakage of a signal is suppressed between the first signal wiring line La and the second signal wiring line Lb and between the third signal wiring line Le and the fourth signal wiring line Lf on the main surface of the insulating layer 11 and in the insulating layer 11. In addition, the leakage of a signal between the first signal wiring line La and the third signal wiring line Le and between the second signal wiring line Lb and the fourth signal wiring line Lf is suppressed.

Figure 5:
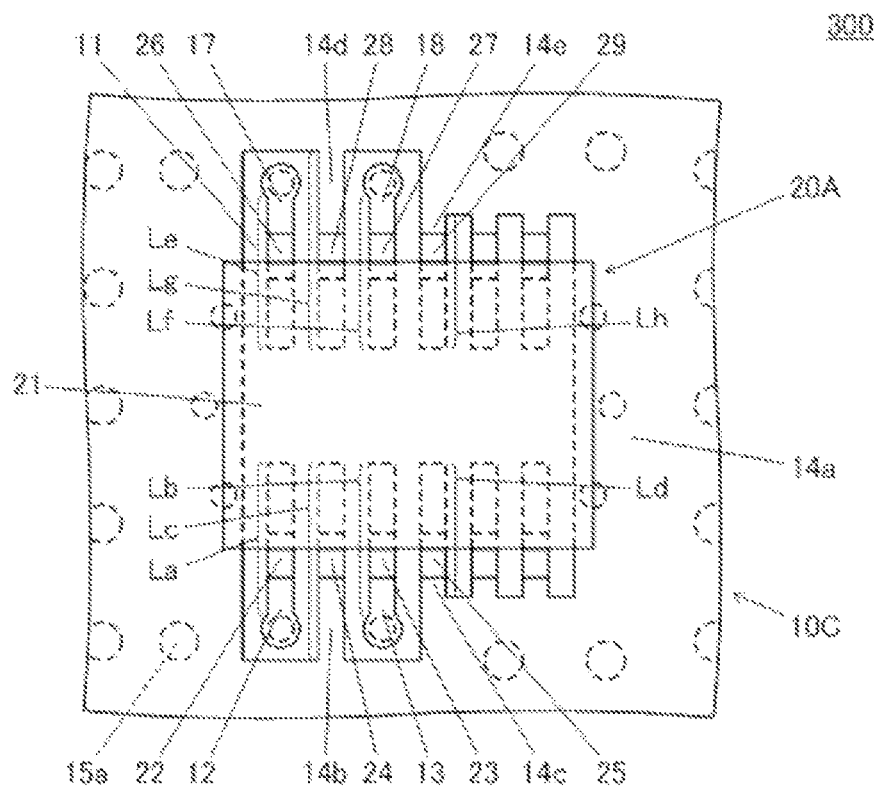
FIG. 5 is a top view of a circuit module that is a comparative example of a circuit module according to the second embodiment of the present disclosure.

FIG. 5 is a top view of a circuit module that is a comparative example of a circuit module according to the second embodiment of the present disclosure. The above signal leakage difference was checked by comparing the isolation in the circuit module 200 and the isolation in a circuit module 300 illustrated in FIG. 5 in which the above strip portion connection via conductors are not provided. The circuit module 300 has the same structure as the circuit module 200 except that the above strip portion connection via conductors are not provided.

Figures 6A, 6B:
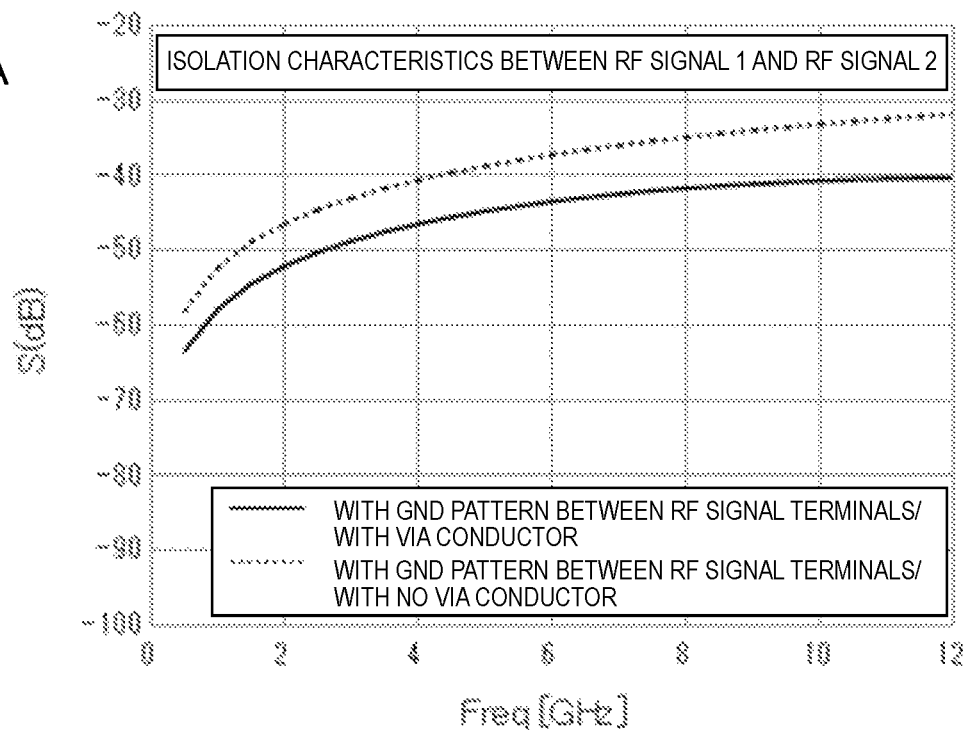
FIG. 6A is a diagram illustrating the comparison between frequency characteristics of the isolation between a first signal wiring line and a second signal wiring line in a circuit module according to the second embodiment of the present disclosure and the isolation between the same two signal wiring lines in a circuit module that is a comparative example.
FIG. 6B is a table indicating measurement values.

FIG. 6A is a diagram illustrating the comparison between frequency characteristics of the isolation between a first signal wiring line and a second signal wiring line in a circuit module according to the second embodiment of the present disclosure and the isolation between the same two signal wiring lines in a circuit module that is a comparative example, and FIG. 6B is a table indicating measurement values. In FIGS. 6A and 6B, the term of "isolation characteristics between RF signal 1 and RF signal 2" means the frequency characteristics of the isolation between the first signal wiring line La and the second signal wiring line Lb.

In the comparison diagram illustrated in FIG. 6A, a solid line represents the frequency characteristics of the isolation between the above signal wiring lines in the circuit module 200 and a dotted line represents the frequency characteristics of the isolation between the above signal wiring lines in the circuit module 300. The table illustrated in FIG. 6B indicates the measurement values of the isolation between the above signal wiring lines in the respective circuit modules at 3 GHz and 6 GHz.

FIGS. 6A and 6B illustrate the effect of the connection of the first strip portion connection via conductor 15b to the first ground wiring line Lc. That is, the above strip portion connection via conductor improves the isolation between the first signal wiring line La and the second signal wiring line Lb.

FIG. 7A is a diagram illustrating the comparison between frequency characteristics of the isolation between the first signal wiring line and a third signal wiring line in a circuit module according to the second embodiment of the present disclosure and the isolation between the same two signal wiring lines in a circuit module that is a comparative example, and FIG. 7B is a table indicating measurement values. In FIGS. 7A and 7B, the term of "isolation characteristics between RF signal 1 and RF signal 3" means the frequency characteristics of the isolation between the first signal wiring line La and the third signal wiring line Le.

In the comparison diagram illustrated in FIG. 7A, a solid line represents the frequency characteristics of the isolation between the above signal wiring lines in the circuit module 200 and a dotted line represents the frequency characteristics of the isolation between the above signal wiring lines in the circuit module 300 like in the case of FIG. 6A. The table illustrated in FIG. 7B indicates the measurement values of the isolation between the above signal wiring lines in the respective circuit modules at 3 GHz and 6 GHz.

FIGS. 7A and 7B illustrate the effect of the connection of the first strip portion connection via conductor 15b to the first ground wiring line Lc, the connection of the third strip portion connection via conductor 15d to the third ground wiring line Lg, and the connection of the fifth strip portion connection via conductor 15f to the fifth strip portion 14f. That is, the above strip portion connection via conductors significantly improve the isolation between the first signal wiring line La and the third signal wiring line Le.

Figures 8A, 8B:
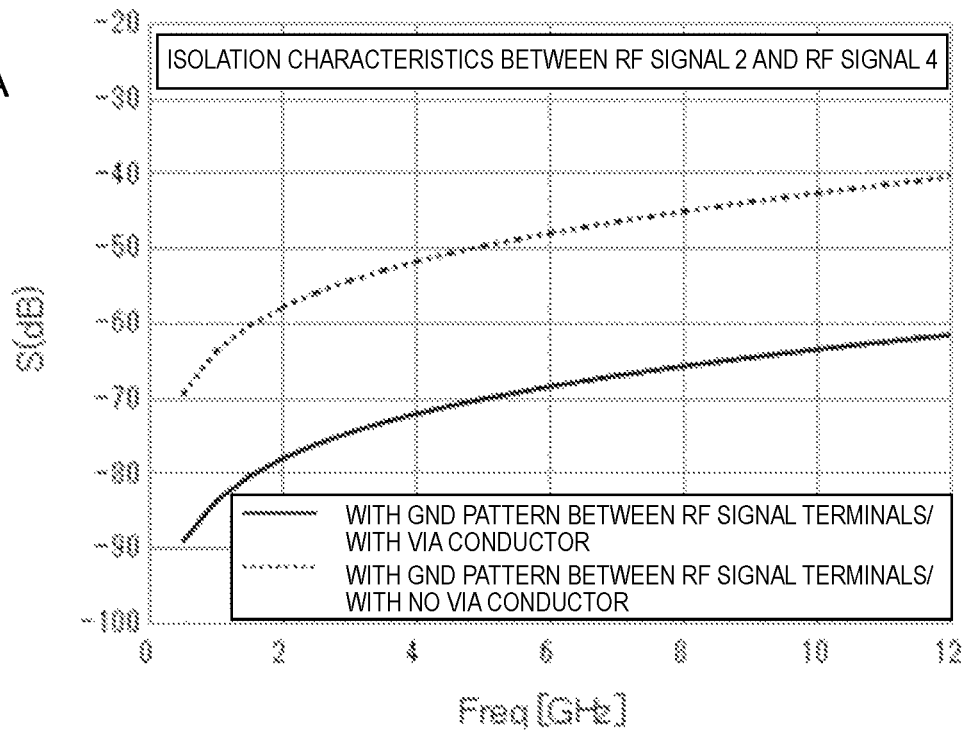
FIG. 8A is a diagram illustrating the comparison between frequency characteristics of the isolation between the second signal wiring line and a fourth signal wiring line in a circuit module according to the second embodiment of the present disclosure and the isolation between the same two signal wiring lines in a circuit module that is a comparative example.
FIG. 8B is a table indicating measurement values.

FIG. 8A is a diagram illustrating the comparison between frequency characteristics of the isolation between the second signal wiring line and a fourth signal wiring line in a circuit module according to the second embodiment of the present disclosure and the isolation between the same two signal wiring lines in a circuit module that is a comparative example, and FIG. 8B is a table indicating measurement values. In FIGS. 8A and 8B, the term of "isolation characteristics between RF signal 2 and RF signal 4" means the frequency characteristics of the isolation between the second signal wiring line Lb and the fourth signal wiring line Lf.

In the comparison diagram illustrated in FIG. 8A, a solid line represents the frequency characteristics of the isolation between the above signal wiring lines in the circuit module 200 and a dotted line represents the frequency characteristics of the isolation between the above signal wiring lines in the circuit module 300 like in the cases of FIGS. 6 and 7. The table illustrated in FIG. 8B indicates the measurement values of the isolation between the above signal wiring lines in the respective circuit modules at 3 GHz and 6 GHz.

FIGS. 8A and 8B illustrate the effect of the connection of the first strip portion connection via conductor 15b to the first ground wiring line Lc, the connection of the second strip portion connection via conductor 15c to the second ground wiring line Ld, the connection of the third strip portion connection via conductor 15d to the third ground wiring line Lg, the connection of the fourth strip portion connection via conductor 15e to the fourth ground wiring line Lh, and the connection of the fifth strip portion connection via conductor 15f to the fifth strip portion 14f. That is, the above strip portion connection via conductors more significantly improve the isolation between the second signal wiring line Lb and the fourth signal wiring line Lf.

—Circuit Module According to Third Embodiment—

The structure of a circuit module according to the third embodiment of the present disclosure will be described with reference to FIG. 9.

Figure 9:
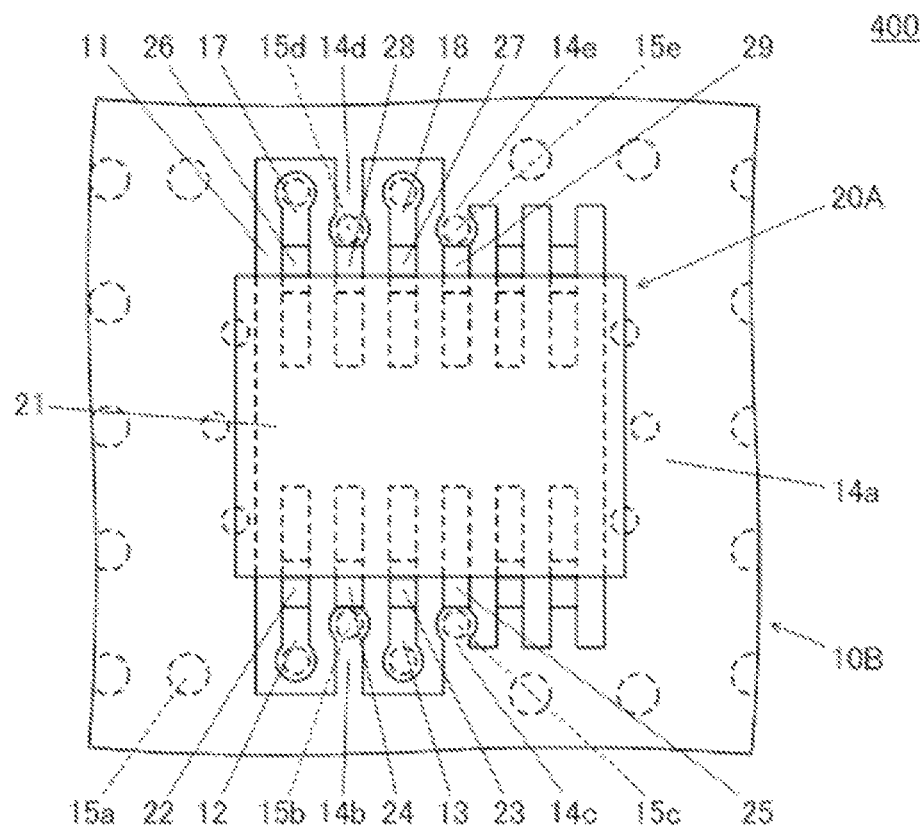
FIG. 9 is a top view of a circuit module according to a third embodiment of the present disclosure.
Figure 10A:
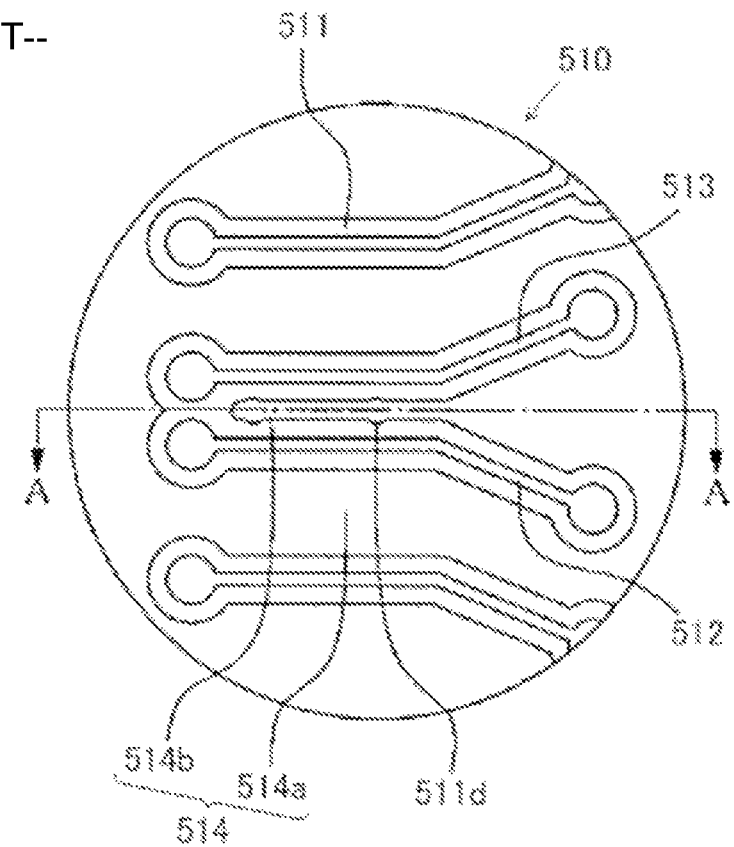
FIGS. 10A and 10B are a top view and a cross-sectional view, respectively, of a circuit board disclosed in Japanese Unexamined Patent Application Publication No. 2017-45814.
Figure 10B:
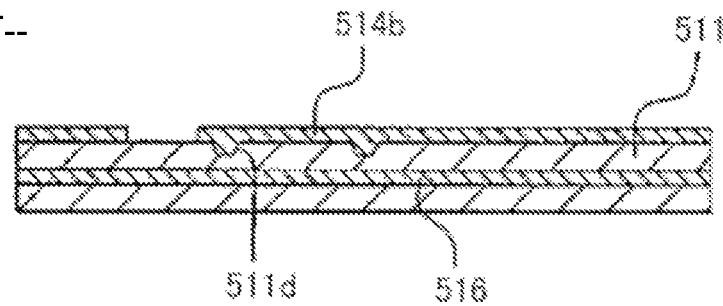

FIG. 9 is a top view of a circuit module according to the third embodiment of the present disclosure. A circuit module 400 includes a circuit board 10B and an electronic component 20A. The circuit board 10B is similar to the circuit board 10A illustrated in FIG. 4, and includes the insulating layer 11, the first signal conductor 12, the second signal conductor 13, the third signal conductor 17, the fourth signal conductor 18, the ground conductor 14, the via conductor 15, and the ground conductor layer 16. However, the ground conductor 14 does not include the fifth strip portion 14f. The first strip portion 14b and the third strip portion 14d are not connected. The second strip portion 14c and the fourth strip portion 14e are not connected. The electronic component 20A is the same as that illustrated in FIG. 4.

Even in the case of the structure of the circuit module 400, the effect of a strip portion connection via conductor connected to each strip portion can be obtained. That is, the leakage of a signal is suppressed between the first signal wiring line La and the second signal wiring line Lb and between the third signal wiring line Le and the fourth signal wiring line Lf on the main surface of the insulating layer 11 and in the insulating layer 11.

The embodiments disclosed herein are intended to be illustrative in all respects and should not be construed as the basis for restrictive interpretations. Therefore, the technical scope of the present disclosure is not intended to be interpreted based on only the above-described embodiments, but rather is defined based on the description in the claims. Moreover, all changes within meanings and scopes equivalent to the claims are embraced.

What is claimed is:

1. A circuit module comprising:
    a circuit board including an insulating layer, a first signal conductor, a second signal conductor, a ground conductor, and a ground conductor layer; and
    an electronic component including a first signal terminal, a second signal terminal, and a first ground terminal, wherein
    the first signal conductor and the second signal conductor are strip conductors placed on a main surface of the insulating layer and including respective portions parallel to each other,
    the ground conductor is placed on the main surface of the insulating layer and includes a first strip portion parallel to the first signal conductor and the second signal conductor between the first signal conductor and the second signal conductor,
    the first signal conductor is connected to the first signal terminal, the second signal conductor is connected to the second signal terminal, and the first strip portion is connected to the first ground terminal,
    when a connection body between the portion of the first signal conductor parallel to the second signal conductor and the first signal terminal is set as a first signal wiring line, a connection body between the portion of the second signal conductor parallel to the first signal conductor and the second signal terminal is set as a second signal wiring line, and a connection body between the first strip portion and the first ground terminal is set as a first ground wiring line, the first ground wiring line is located between the first signal wiring line and the second signal wiring line in a region where the first signal wiring line and the second signal wiring line are parallel to each other,
    the circuit board includes at least one first strip portion connection via conductor that connects the first strip portion and the ground conductor layer in the region where the first signal wiring line and the second signal wiring line are parallel to each other,
    the ground conductor further includes a second strip portion that is adjacently in parallel with the second signal conductor,
    the electronic component further includes a second ground terminal,
    the second strip portion is connected to the second ground terminal,
    when a connection body between the second strip portion and the second ground terminal is set as a second ground wiring line, the second ground wiring line is adjacent to the second signal wiring line to sandwich the second signal wiring line along with the first ground wiring line,
    the circuit board further includes at least one second strip portion connection via conductor that connects the second strip portion and the ground conductor layer,
    at least one of the following:
        the at least one first strip portion connection via conductor is positioned within a perimeter of the electronic component in plan view and the first strip portion includes a first strip portion section which extends beyond the perimeter of the electronic component, or
        the at least one second strip portion connection via conductor is positioned within the perimeter of the electronic component in plan view and the second strip portion includes a second strip portion section which extends beyond the perimeter of the electronic component, and at least one of the following:
the first signal conductor includes a first signal conductor section that extends within the perimeter of the electronic component in plan view, and the first signal conductor section is absent any via conductor, or
the second signal conductor includes a second signal conductor section that extends within the perimeter of the electronic component in plan view, and the second signal conductor section is absent any via conductor.

2. The circuit module according to claim 1, wherein the first strip portion connection via conductor is placed in a middle portion of the first ground wiring line in the region where the first signal wiring line and the second signal wiring line are parallel to each other.

3. A circuit module comprising:
a circuit board including an insulating layer, a first signal conductor, a second signal conductor, a ground conductor, and a ground conductor layer; and
an electronic component including a first signal terminal, a second signal terminal, and a first ground terminal, wherein
the first signal conductor and the second signal conductor are strip conductors placed on a main surface of the insulating layer and including respective portions parallel to each other,
the ground conductor is placed on the main surface of the insulating layer and includes a first strip portion parallel to the first signal conductor and the second signal conductor between the first signal conductor and the second signal conductor,
the first signal conductor is connected to the first signal terminal, the second signal conductor is connected to the second signal terminal, and the first strip portion is connected to the first ground terminal,
when a connection body between the portion of the first signal conductor parallel to the second signal conductor and the first signal terminal is set as a first signal wiring line, a connection body between the portion of the second signal conductor parallel to the first signal conductor and the second signal terminal is set as a second signal wiring line, and a connection body between the first strip portion and the first ground terminal is set as a first ground wiring line, the first ground wiring line is located between the first signal wiring line and the second signal wiring line in a region where the first signal wiring line and the second signal wiring line are parallel to each other,
the circuit board includes at least one first strip portion connection via conductor that connects the first strip portion and the ground conductor layer in the region where the first signal wiring line and the second signal wiring line are parallel to each other,
the ground conductor further includes a second strip portion that is adjacently in parallel with the second signal conductor,
the electronic component further includes a second ground terminal,
the second strip portion is connected to the second ground terminal,
when a connection body between the second strip portion and the second ground terminal is set as a second ground wiring line, the second ground wiring line is adjacent to the second signal wiring line to sandwich the second signal wiring line along with the first ground wiring line,
the circuit board further includes at least one second strip portion connection via conductor that connects the second strip portion and the ground conductor layer,
the circuit board further includes a third signal conductor and a fourth signal conductor,
the third signal conductor and the fourth signal conductor are strip conductors placed on the main surface of the insulating layer and including respective portions parallel to each other,
the third signal conductor extends to face the first signal conductor on an axis on which the first signal conductor extends,
the fourth signal conductor extends to face the second signal conductor on an axis on which the second signal conductor extends,
the ground conductor further includes a third strip portion parallel to the third signal conductor and the fourth signal conductor between the third signal conductor and the fourth signal conductor,
the third strip portion extends to face the first strip portion on an axis on which the first strip portion extends,
the electronic component further includes a third signal terminal, a fourth signal terminal, and a third ground terminal,
the third signal conductor is connected to the third signal terminal, the forth signal conductor is connected to the forth signal terminal, and the third strip portion is connected to the third ground terminal,
when a connection body between the portion of the third signal conductor parallel to the fourth signal conductor and the third signal terminal is set as a third signal wiring line, a connection body between the portion of the fourth signal conductor parallel to the third signal conductor and the fourth signal terminal is set as a fourth signal wiring line, and a connection body between the third strip portion and the third ground terminal is set as a third ground wiring line, the third ground wiring line is located between the third signal wiring line and the fourth signal wiring line in a region where the third signal wiring line and the fourth signal wiring line are parallel to each other, and
the circuit board further includes at least one third strip portion connection via conductor that connects the third strip portion and the ground conductor layer in the region where the third signal wiring line and the fourth signal wiring line are parallel to each other.

4. The circuit module according to claim 3, wherein the third strip portion connection via conductor is place in a middle portion of the third ground wiring line in the region where the third signal wiring line and the fourth signal wiring line are parallel to each other.

5. The circuit module according to claim 3, wherein the ground conductor further includes a fourth strip portion that is adjacently in parallel with the fourth signal conductor,
the electronic component further includes a fourth ground terminal,
the fourth strip portion is connected to the fourth ground terminal,
when a connection body between the fourth strip portion and the fourth ground terminal is set as a fourth ground wiring line, the fourth ground wiring line is adjacent to the fourth signal wiring line to sandwich the fourth signal wiring line along with the third ground wiring line, and the circuit board further includes at least one fourth strip portion connection via conductor that connects the fourth strip portion and the ground conductor layer.

6. The circuit module according to claim 3, wherein the ground conductor further includes a fifth strip portion that extends in a direction orthogonal to the first strip portion and the third strip portion, the first strip portion and the third strip portion are connected to the fifth strip portion, and the circuit board further includes at least one fifth strip portion connection via conductor that connects the fifth strip portion and the ground conductor layer.

7. The circuit module according to claim 2, wherein the circuit board further includes a third signal conductor and a fourth signal conductor, the third signal conductor and the fourth signal conductor are strip conductors placed on the main surface of the insulating layer and including respective portions parallel to each other, the third signal conductor extends to face the first signal conductor on an axis on which the first signal conductor extends, the fourth signal conductor extends to face the second signal conductor on an axis on which the second signal conductor extends, the ground conductor further includes a third strip portion parallel to the third signal conductor and the fourth signal conductor between the third signal conductor and the fourth signal conductor, the third strip portion extends to face the first strip portion on an axis on which the first strip portion extends, the electronic component further includes a third signal terminal, a fourth signal terminal, and a third ground terminal, the third signal conductor is connected to the third signal terminal, the forth signal conductor is connected to the forth signal terminal, and the third strip portion is connected to the third ground terminal, when a connection body between the portion of the third signal conductor parallel to the fourth signal conductor and the third signal terminal is set as a third signal wiring line, a connection body between the portion of the fourth signal conductor parallel to the third signal conductor and the fourth signal terminal is set as a fourth signal wiring line, and a connection body between the third strip portion and the third ground terminal is set as a third ground wiring line, the third ground wiring line is located between the third signal wiring line and the fourth signal wiring line in a region where the third signal wiring line and the fourth signal wiring line are parallel to each other, and the circuit board further includes at least one third strip portion connection via conductor that connects the third strip portion and the ground conductor layer in the region where the third signal wiring line and the fourth signal wiring line are parallel to each other.

8. The circuit module according to claim 7, wherein the third strip portion connection via conductor is place in a middle portion of the third ground wiring line in the region where the third signal wiring line and the fourth signal wiring line are parallel to each other.

9. The circuit module according to claim 4, wherein the ground conductor further includes a fourth strip portion that is adjacently in parallel with the fourth signal conductor, the electronic component further includes a fourth ground terminal, the fourth strip portion is connected to the fourth ground terminal, when a connection body between the fourth strip portion and the fourth ground terminal is set as a fourth ground wiring line, the fourth ground wiring line is adjacent to the fourth signal wiring line to sandwich the fourth signal wiring line along with the third ground wiring line, and the circuit board further includes at least one fourth strip portion connection via conductor that connects the fourth strip portion and the ground conductor layer.

10. The circuit module according to claim 7, wherein the ground conductor further includes a fourth strip portion that is adjacently in parallel with the fourth signal conductor, the electronic component further includes a fourth ground terminal, the fourth strip portion is connected to the fourth ground terminal, when a connection body between the fourth strip portion and the fourth ground terminal is set as a fourth ground wiring line, the fourth ground wiring line is adjacent to the fourth signal wiring line to sandwich the fourth signal wiring line along with the third ground wiring line, and the circuit board further includes at least one fourth strip portion connection via conductor that connects the fourth strip portion and the ground conductor layer.

11. The circuit module according to claim 8, wherein the ground conductor further includes a fourth strip portion that is adjacently in parallel with the fourth signal conductor, the electronic component further includes a fourth ground terminal, the fourth strip portion is connected to the fourth ground terminal, when a connection body between the fourth strip portion and the fourth ground terminal is set as a fourth ground wiring line, the fourth ground wiring line is adjacent to the fourth signal wiring line to sandwich the fourth signal wiring line along with the third ground wiring line, and the circuit board further includes at least one fourth strip portion connection via conductor that connects the fourth strip portion and the ground conductor layer.

12. The circuit module according to claim 4, wherein the ground conductor further includes a fifth strip portion that extends in a direction orthogonal to the first strip portion and the third strip portion, the first strip portion and the third strip portion are connected to the fifth strip portion, and the circuit board further includes at least one fifth strip portion connection via conductor that connects the fifth strip portion and the ground conductor layer.

13. The circuit module according to claim 5, wherein the ground conductor further includes a fifth strip portion that extends in a direction orthogonal to the first strip portion and the third strip portion, the first strip portion and the third strip portion are connected to the fifth strip portion, and the circuit board further includes at least one fifth strip portion connection via conductor that connects the fifth strip portion and the ground conductor layer.

14. The circuit module according to claim 7, wherein
the ground conductor further includes a fifth strip portion that extends in a direction orthogonal to the first strip portion and the third strip portion,
the first strip portion and the third strip portion are connected to the fifth strip portion, and
the circuit board further includes at least one fifth strip portion connection via conductor that connects the fifth strip portion and the ground conductor layer.

15. The circuit module according to claim 8, wherein
the ground conductor further includes a fifth strip portion that extends in a direction orthogonal to the first strip portion and the third strip portion,
the first strip portion and the third strip portion are connected to the fifth strip portion, and
the circuit board further includes at least one fifth strip portion connection via conductor that connects the fifth strip portion and the ground conductor layer.

16. The circuit module according to claim 9, wherein
the ground conductor further includes a fifth strip portion that extends in a direction orthogonal to the first strip portion and the third strip portion,
the first strip portion and the third strip portion are connected to the fifth strip portion, and
the circuit board further includes at least one fifth strip portion connection via conductor that connects the fifth strip portion and the ground conductor layer.

17. The circuit module according to claim 10, wherein
the ground conductor further includes a fifth strip portion that extends in a direction orthogonal to the first strip portion and the third strip portion,
the first strip portion and the third strip portion are connected to the fifth strip portion, and
the circuit board further includes at least one fifth strip portion connection via conductor that connects the fifth strip portion and the ground conductor layer.

18. The circuit module according to claim 11, wherein
the ground conductor further includes a fifth strip portion that extends in a direction orthogonal to the first strip portion and the third strip portion,
the first strip portion and the third strip portion are connected to the fifth strip portion, and
the circuit board further includes at least one fifth strip portion connection via conductor that connects the fifth strip portion and the ground conductor layer.

* * * * *